United States Patent
Boulard et al.

(10) Patent No.: US 10,141,470 B2
(45) Date of Patent: Nov. 27, 2018

(54) PHOTODIODE TYPE STRUCTURE, COMPONENT AND METHOD FOR MANUFACTURING SUCH A STRUCTURE

(71) Applicant: COMMISSARIAT A L'ENERGIE ATOMIQUE ET AUX ENERGIES ALTERNATIVES, Paris (FR)

(72) Inventors: Francois Boulard, Grenoble (FR); Giacomo Badano, Lans En Vercors (FR); Olivier Gravrand, Fontanil Cornillon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/433,782

(22) Filed: Feb. 15, 2017

(65) Prior Publication Data
US 2017/0244001 A1    Aug. 24, 2017

(30) Foreign Application Priority Data
Feb. 18, 2016 (FR) .................. 16 00270

(51) Int. Cl.
*H01L 31/103* (2006.01)
*H01L 31/18* (2006.01)
(Continued)

(52) U.S. Cl.
CPC .... *H01L 31/1032* (2013.01); *H01L 31/02161* (2013.01); *H01L 31/02966* (2013.01);
(Continued)

(58) Field of Classification Search
None
See application file for complete search history.

(56) References Cited

U.S. PATENT DOCUMENTS 5,602,414 A    2/1997   Mitsui et al.
7,459,730 B1   12/2008  Kinch
(Continued)

FOREIGN PATENT DOCUMENTS

JP    5853866    2/2016

OTHER PUBLICATIONS

French Preliminary Search Report dated Nov. 3, 2016 in French Application 16 00270 filed on Feb. 18, 2018 (with English Translation of Categories of Cited Documents).
(Continued)

*Primary Examiner* — Mounir Amer
(74) *Attorney, Agent, or Firm* — Oblon, McClelland, Maier & Neustadt, L.L.P.

(57) ABSTRACT

The invention relates to a photodiode type structure (comprising: a support (100) including at least one semiconductor layer, the semiconductor layer (120) including of a first semiconductor zone (10) of a first type of conductivity and a mesa (130) in contact with the semiconductor layer (120). The mesa (130) includes of a second semiconductor zone (20), known as absorption zone, said second semiconductor zone (20) being of a second type of conductivity. The second semiconductor zone has a concentration of majority carriers such that the second semiconductor zone (30) is depleted in the absence of polarization of the structure (1). The structure (1) further comprises a third semiconductor zone (30) of the second type of conductivity made of a third material transparent in the absorbed wavelength range. The third semiconductor zone (30) is interposed between the first and the second semiconductor zones (10, 20) while being at least partially arranged in the semiconductor layer (120). The invention also relates to a component and a method for manufacturing such a structure (1).

15 Claims, 3 Drawing Sheets

(51) Int. Cl.
H01L 31/0224 (2006.01)
H01L 31/0216 (2014.01)
H01L 31/0296 (2006.01)
H01L 31/0352 (2006.01)

(52) U.S. Cl.
CPC ........ H01L 31/022408 (2013.01); H01L 31/03529 (2013.01); H01L 31/035281 (2013.01); H01L 31/1035 (2013.01); H01L 31/1832 (2013.01); *Y02E 10/50* (2013.01)

(56) References Cited

U.S. PATENT DOCUMENTS

| | | | | |
|---|---|---|---|---|
| 8,828,781 | B1* | 9/2014 | Roizin | H01L 27/142 257/190 |
| 2001/0050397 | A1* | 12/2001 | Matsumoto | H01L 21/76264 257/347 |
| 2007/0034898 | A1 | 2/2007 | Tennant et al. | |
| 2014/0001592 | A1* | 1/2014 | Yamabi | H01L 31/02002 257/466 |
| 2015/0303320 | A1 | 10/2015 | Boulard et al. | |
| 2015/0357361 | A1* | 12/2015 | Kajiyama | H01L 27/14607 257/440 |

OTHER PUBLICATIONS

P.Martyniuk et al. "Barrier infrared detectors," Opto-Electronics Review 22(2), 2014, pp. 20.
K.Jozwikowski et al. "Generation-Recombination Effect in High-Temperature HgCdTe Heterostructure Nonequilibrium Photodiodes," Journal of Electronic Materials, vol. 38, No. 8, 2009. pp. 11.

\* cited by examiner

PHOTODIODE TYPE STRUCTURE, COMPONENT AND METHOD FOR MANUFACTURING SUCH A STRUCTURE

TECHNICAL FIELD

The invention relates to photodiodes and more specifically pertains to photodiodes suited for detecting and/or measuring electromagnetic radiation in the infrared range.

The invention more particularly concerns a photodiode type semiconductor structure, a semiconductor component comprising at least one such structure and a method for manufacturing such a structure.

PRIOR ART

Photodiode type semiconductor structures generally comprises of a semiconductor support in which are arranged a first and a second semiconductor zone in contact with each other and having respectively a first and a second type of conductivity opposite to each other. In this way, the first and the second zone form together, at the level of their contact, a semiconductor junction.

Thus, by reverse polarizing the junction by means of an external polarization, when a photon, having an energy greater than that of the forbidden band of the semiconductor material, penetrates the semiconductor junction, it is going to generate an electron-hole pair and thus a current in the junction. Since this current is directly proportional to the electromagnetic radiation, it provides a measurement of this same electromagnetic radiation.

Although such technology is well suited to the detection and the measurement of electromagnetic radiation, it nevertheless has the drawback of having a non-zero dark current, which contributes to degrading the signal to noise ratio of such a structure. The origin of the dark current is the generation of non-photogenerated electron-hole pairs in the structure. Yet this generation also takes place in the active zone of the structure in which the photons are absorbed to generate the signal. In order to maximize the signal, this zone must occupy a large part of the volume of the structure. It generally extends over practically the entire surface of the structure, and is thus at the origin of an important dark current.

This is all the more true for structures suited to operating in infrared wavelengths, the latter being subjected to important noise on account of the narrow forbidden band gap of the material in which they are formed. In fact, a narrow forbidden band gap favors the formation of a dark current of thermal origin in the active zone. For this reason, structures suited to operating in infrared wavelengths are generally cooled.

To overcome this drawback, it is known to limit the absorption of electromagnetic radiation to a reduced zone of the structure in which is arranged the junction and thus the active zone. Thus, the structure may receive electromagnetic radiation on an important surface without all the same requiring an active zone occupying an important volume.

It is this possibility that is exploited by K. Jóźwikowski and his co-authors within the scope of their work published in the scientific journal "Journal of Electronic Materials" Volume 38 number 8 pages 1666 to 1676, 24 Mar. 2009. In fact in this article K. Jóźwikowski and his co-authors describe a semiconductor structure wherein the active zone is included in a mesa.

This structure comprises:
a support including a semiconductor layer in which is partially arranged a first semiconductor zone of a first type of conductivity and made of a material having a forbidden band gap such that the first semiconductor zone is transparent in a first wavelength range,
a mesa, the mesa comprising a second part of the first zone and a second semiconductor zone of a second type of conductivity opposite to the first type of conductivity so as to form with the first semiconductor zone a semiconductor junction, the second semiconductor zone being made of a second semiconductor material having a forbidden band gap suited to favoring absorption of electromagnetic radiation, the second semiconductor zone having a concentration of majority carriers such that the second semiconductor zone is included within the space charge zone, and is thus depleted, in the absence of polarization of the structure.

In this way, the active zone of the structure, formed by the second semiconductor zone, is delimited by the mesa and thus has a reduced volume. The generation of dark current therein is relatively weak. In addition, Auger phenomena generating dark current require three bodies interaction and since the second semiconductor zone is configured to be depleted, Auger phenomena thus cannot take place therein. Thus, such a structure has the advantage of comprising an active zone with a particularly weak generation of dark current.

Nevertheless, if such a structure has a reduced dark current vis-à-vis the prior art, the first zone and the junction of this structure remain at the origin of a non-negligible dark current. In fact, the junction intercepts the mesa sides which are rich in crystalline defects and may thus be the center of a relatively important generation of dark current. Such a dark current does not make it possible to envisage measurements and/or detections of electromagnetic radiation at "relatively high" temperatures, making it possible to resort to a lightened cooling system.

DESCRIPTION OF THE INVENTION

The invention aims to overcome these drawbacks and thus has the objective of providing a photodiode type structure having reduced dark noise vis-à-vis structures of the prior art in a manner notably to allow higher operating temperatures.

The invention relates in this respect to a photodiode type structure intended to receive electromagnetic radiation in a first wavelength range, the structure comprising:
a support including at least one semiconductor layer, the semiconductor layer comprising a first semiconductor zone of a first type of conductivity and made of a first material having a forbidden band gap such that the first semiconductor zone is transparent in the first wavelength range,
a mesa in contact with the semiconductor layer, the mesa including a second semiconductor zone, known as absorption zone, said second semiconductor zone being of a second type of conductivity opposite to the first type of conductivity so as to form a semiconductor junction having a space charge zone, the second semiconductor zone being made of a semiconductor material having a forbidden band gap suited to favoring absorption of electromagnetic radiation, the second semiconductor zone having a concentration of majority carriers such that the second semiconductor zone is included within the space charge zone, and is thus depleted, in the absence of polarization of the structure, the structure further comprising a third semiconductor zone of the second type of conductivity and made of a third material having a forbidden band gap such that the third gone is transparent in the first wavelength range, said third semiconductor zone being interposed between the first and the second semiconductor zone while being at least partially arranged in the semiconductor layer and while forming the semiconductor junction with the first semiconductor zone in the semiconductor layer, and a potential barrier for minority carriers of the second semiconductor zone with the second semiconductor zone.

With such a structure, it is possible to have an absorption zone, the second semiconductor zone, little prone to dark current on account of its depleted character and its delimitation by the mesa, while ensuring that the junction is not itself a generator of dark current. In fact, the addition of third semiconductor zone makes it possible to form the junction in the semiconductor layer at a distance from defects located at the level of the sides of the mesa which are dark current generators. The dark current generated by the junction is reduced vis-à-vis structures of the prior art.

In addition since the absorption zone, the second zone, is depleted, the collection of photogenerated carriers in the latter takes place by drift and not by diffusion. The result is a particularly reproducible response of the structure, which makes it compatible with a calibration procedure during the procedure for manufacturing the structure, and a low concentration of defects in the absorption zone, leading to a reduction in the noise of the structure.

Above and in the remainder of this document, depleted semiconductor zone is taken to mean the fact that the latter zone has been emptied of these carriers on account of the electric field present in the structure, such depleted semiconductor zones generally being associated with a space charge zone of the structure.

Above and in the remainder of this document mesa is taken to mean a semiconductor region projecting from a support or from a semiconductor layer, such a region housing a functional part of a semiconductor structure in order to insulate it from the remainder of the semiconductor structure, said functional part being connected to the remainder of the structure uniquely by the base of the mesa. Such a mesa generally has a height along a direction transversal to the surface of the support or the semiconductor layer, and lateral dimensions along a plane parallel to the surface of the support or the semiconductor layer. The height of a mesa is generally at least less than 2 times, or even 4 to 10 times, the maximum lateral dimension.

A third semiconductor zone interposed between the first and the second semiconductor zones should be taken to mean that the third semiconductor zone forms an interface between the first and the second semiconductor zones. Thus, with such a configuration, the first and the second zones are not in contact and the semiconductor junction is formed uniquely between the first and the third semiconductor zones. It may be noted, in addition, that with such a configuration, since the third semiconductor zone is arranged partially in the semiconductor layer, the junction is formed in the semiconductor layer at a distance from the mesa. Obviously, such an interposition of the third semiconductor zone between the first and the second semiconductor zones does not exclude the presence of other elements of the structure between the first and the second semiconductor zones, as long as the interface between the first and the second zones includes the third semiconductor zone. It may perfectly be envisaged that the structure includes, between the third and the second semiconductor zone, a so-called buffer layer in order to absorb part of the crystallographic stresses between the third and the second semiconductor zones.

The first and the third material may be identical.

In this way, the interface between the first and the third semiconductor zones is homogeneous and thus has few crystalline defects. In this way, the dark current that could be generated is interface is limited.

The third semiconductor zone may be partially arranged in the semiconductor layer, a part of the third semiconductor zone being arranged in the mesa.

In this way, the second zone, that is to say the active zone of the structure, is particularly far away from the interface between the mesa and the semiconductor layer which may be a generator of dark noise.

The third semiconductor zone may be totally arranged in the semiconductor layer.

Such a structure is particularly easy to manufacture, since the mesa may be formed of a single material, that of the second semiconductor zone.

The mesa may have a top, opposite to the surface of the support, and sides connecting the top to the surface of the support;

the structure further comprising a passivation layer and a metal contact pad in contact with the top of the mesa, the passivation layer being arranged to passivate the surface of the sides and the top of the mesa which is not in contact with the metal pad.

With such a passivation, the generation of noise in the active zone of the structure, that is to say the second semiconductor zone, is limited since the sides of the mesa in which it is laid out are passivated.

The structure may further includes a metal layer which, with the metal contact pad, covers the passivation layer on the part thereof covering the surface of the sides and the top of the mesa.

Such a metal layer may make it possible to improve the optical confinement of the mesa and thus of the second semiconductor zone that it includes and thus improve the absorption of electromagnetic radiation since the latter is trapped in the cavity formed by the mesa.

The first, the second and the third material may be mercury-cadmium tellurides of $Cd_xHg_{1-x}Te$ type with x comprised between 1 and 0, 0 and 1 excluded.

In this way, the interfaces between the first, second and third semiconductor zones may have good crystalline quality, the mercury-cadmium tellurides having a low variation of the lattice parameter with the proportion x of mercury.

The first type of conductivity may be that for which the majority carriers are electrons, the second type of conductivity being that for which the majority carriers are holes.

The concentration of majority carriers in the first semiconductor zone may be provided mainly by mercury Hg vacancies.

In this way, it is possible to use a manufacturing method

The invention further relates to a component for the detection and/or measurement of electromagnetic in a given wavelength range, said component comprising a plurality of photodiode type structures, the component comprising at least one structure according to the invention.

Such a component benefits from the advantages linked to the at least one structure according to the invention that it comprises.

The invention further relates to a method for manufacturing a photodiode type semiconductor structure intended to receive electromagnetic radiation in a given wavelength range, the method comprising the following steps of:

providing a semiconductor support comprising at least one semiconductor layer, forming a mesa at the surface of the semiconductor layer, laying out in the semiconductor layer and in the mesa, a first, a second and a third semiconductor zone, the first zone being laid out in the semiconductor layer and being of a first type of conductivity and made of a first material having a forbidden band gap such that the first semiconductor zone is transparent in the first wavelength range, the second semiconductor zone being of a second type of conductivity opposite to the first type of conductivity so to form a semiconductor junction having a space charge zone, the second semiconductor zone being made of a second semiconductor material having a forbidden band gap suited to favoring the absorption of electromagnetic radiation, the second semiconductor zone having a concentration of majority carriers such that the second semiconductor zone is indicated within the space charge zone, and is thus depleted in the absence of polarization of the structure, the third semiconductor zone being of the second type of conductivity and made of a third material having a forbidden band gap such that the third zone is transparent in the first wavelength range, said third semiconductor zone being interposed between the first and the second semiconductor zones while being at least partially arranged in the semiconductor layer and while forming the semiconductor junction with the first semiconductor zone in the semiconductor layer, and a potential barrier for the minority carriers of the second semiconductor zone with the second semiconductor zone.

Such a method enables the manufacture of a structure according to the invention and thus to benefit from the advantages that are linked thereto.

During the step of providing the support, the semiconductor layer may be made of a mercury-cadmium telluride of $Cd_xHg_{1-x}Te$ type, with x comprised between 0 and 1, 0 and 1 excluded, and may have the first type of conductivity, the first type of conductivity being that in which the majority carriers are holes, the majority carriers in the semiconductor layer being mainly provided by mercury Hg vacancies, the step of laying out the first, second and third semiconductor zones being able to include a sub-step of diffusion of mercury into a part of the semiconductor layer so as to fill the mercury Hg vacancies and neutralize the holes to reverse the type of conductivity in said part of the semiconductor layer and thus form the third semiconductor zone, the remainder of the semiconductor layer then forming the second semiconductor zone.

In this way, it is possible to form the third semiconductor zone easily, since it is simply formed by neutralization of the mercury vacancies.

During the step of laying out the first, second and third semiconductor zones, the sub-step of diffusion may include a step of ion implantation of the mesa suited to releasing mercury Hg.

During the step of laying out the first, second and third semiconductor zones, the sub-step of diffusion may include a step of partial etching of the mesa suited to releasing mercury Hg.

During the step of laying out the first, second and third semiconductor zones, the sub-step of diffusion may include a step of thermal diffusion of mercury into the mesa.

Such laying out steps are particularly suited to providing a structure according to the invention with preserved crystalline quality between the first and the second zones since the lay out of the third zone is obtained by simple diffusion of mercury.

More specifically, when the invention relates to a structure of which the first, second and third materials are mercury-cadmium tellurides of $Cd_xHg_{1-x}Te$ type with x comprised between 1 and 0, 0 and 1 excluded, the first and third materials being identical and the type of conductivity of the first material being provided by mercury vacancies, the invention more specifically relates to:

firstly a method for manufacturing a photodiode type semiconductor structure intended to receive electromagnetic radiation in a given wavelength range, the method comprising the following steps of:

providing a semiconductor support comprising at least one semiconductor layer, the semiconductor layer being formed of a first material having a forbidden band gap such that the semiconductor layer is transparent in the first wavelength range, forming a mesa on the surface of the semiconductor layer, the mesa including of a second semiconductor material having a forbidden band gap suited to favoring absorption of electromagnetic radiation, the remainder of the mesa being made of the first material, dry etching a part of the mesa so as to release mercury Hg and cause a migration of the mercury Hg thus released so as to fill the mercury vacancies of the first material to modify the type of conductivity thereof from the first type to the second type of conductivity and thus form at least partially a third semiconductor zone in the semiconductor layer, said migration of mercury thus enabling a lay out in the semiconductor layer and in the mesa, of a first, a second and a third semiconductor zone, the first zone corresponding to the zone of the semiconductor layer free of migration of mercury, the second zone corresponding to the second semiconductor material of the mesa, the third semiconductor zone comprising the zone of the semiconductor layer into which mercury has migrated and being interposed between the first and the second semiconductor zones, the third semiconductor zone forming with the first semiconductor zone semiconductor junction having a space charge zone, the second semiconductor zone having a concentration of majority carriers such that the second semiconductor zone is included within the space charge zone, and is thus depleted in the absence of polarization of the structure, the third semiconductor zone being of the second type of conductivity and forming the semiconductor junction with the first semiconductor zone in the semiconductor layer, and a potential barrier for the minority carriers of the second semiconductor zone with the second semiconductor zone.

then a method for manufacturing a photodiode type semiconductor structure intended to receive electromagnetic radiation in a given wavelength range, the method comprising the following steps of:

providing a semiconductor support comprising at least one semiconductor layer, the semiconductor layer being formed of a first material having a forbidden band gap such that the semiconductor layer is transparent in the first wavelength range, forming a mesa on the surface the semiconductor layer, the mesa including a second semiconductor material having a forbidden band gap suited to favoring absorption electromagnetic radiation, the remainder of mesa being made of the first material, ion implantation of a part of the mesa so as to release mercury Hg and cause a migration of the mercury Hg thus released so as to fill the mercury vacancies of the first material to modify the type of conductivity from the first type to the second type of conductivity and thus form at least partially a third semiconductor zone in the semiconductor layer, said migration of mercury thus enabling a lay out in the semiconductor layer and in the mesa, of a first, a second and a third semiconductor zone, the first zone corresponding to the zone of the semiconductor layer free of migration of mercury, the second zone corresponding to the second semiconductor material of the mesa, the third semiconductor zone comprising the zone of the semiconductor layer into which the mercury has migrated and being interposed between the first and the second semiconductor zones, the third semiconductor zone forming with the first semiconductor zone a semiconductor junction having a space charge one, the second semiconductor zone having a concentration of majority carriers such that the second semiconductor zone is included within the space charge zone, and is thus depleted in the absence of polarization of the structure, the third semiconductor zone being of the second type of conductivity and forming the semiconductor junction with the first semiconductor zone in the semiconductor layer, and potential barrier for the minority carriers of the second semiconductor zone with the second semiconductor zone, and finally a method for manufacturing a photodiode type semiconductor structure intended to receive electromagnetic radiation in a given wavelength range, the method comprising the following steps of:

providing a semiconductor support comprising at least one semiconductor layer, the semiconductor layer being formed first material having a forbidden band gap such that the semiconductor layer is transparent in the first wavelength range, forming a mesa on the surface semiconductor layer, the mesa including a second semiconductor material having a forbidden band gap suited to favoring absorption of electromagnetic radiation, remainder of the mesa being made of the first material, thermal diffusion of mercury Hg into the semiconductor layer from the mesa so as to fill the mercury vacancies of the first material to modify thereof the type of conductivity from the first type to the second type of conductivity and thus form at least partially a third semiconductor zone in the semiconductor layer, said diffusion of mercury thus enabling a lay out in the semiconductor layer and in the mesa, of a first, a second and a third semiconductor zone, the first zone corresponding to the zone of the semiconductor layer free of migration of mercury, the second zone corresponding to the second semiconductor of the mesa, the third semiconductor zone comprising the zone of the semiconductor layer into which the mercury has migrated and being interposed between the first and the second semiconductor zones, the third semiconductor zone forming with the first semiconductor zone a semiconductor junction having a space charge zone, the second semiconductor zone having a concentration of majority carriers such that the second semiconductor zone is included within the space charge zone, and is thus depleted in the absence of polarization of the structure, the third semiconductor zone being of the second type of conductivity and forming the semiconductor junction with the first semiconductor zone in the semiconductor layer, and a potential barrier for the minority carriers of the second semiconductor zone with the second semiconductor zone.

These manufacturing methods of the invention make it possible, while benefiting from the specificities of mercury-cadmium tellurides, to obtain a structure according to the invention with a minimum of steps and while having interfaces between the first, second and third semiconductor zones of good crystalline quality.

BRIEF DESCRIPTION OF THE DRAWINGS

The present invention will be better understood on reading the description of exemplary embodiments, given for purely indicative purposes and in no way limiting, while referring to the appended drawings in which:

FIGS. 3A and 3B illustrate two mesa conformations compatible with the invention, FIG. 3A corresponding to a mesa with vertical sides, FIG. 3B corresponding to a mesa with oblique sides, FIGS. 4A to 4C schematically illustrate the structures according to the invention obtained from three manufacturing methods according to the invention, FIG. 4A illustrating a structure obtained by means of ion implantation, FIG. 4B illustrating a structure obtained by means of dry etching and FIG. 4C illustrating a structure obtained by means of localized diffusion.

The different parts represented in the figures are not necessarily according to a uniform scale, to make the figures more legible.

The different possibilities (variants and embodiments) should be understood as not being mutually exclusive and may be combined together.

DETAILED DESCRIPTION OF PARTICULAR EMBODIMENTS

Figure 1:
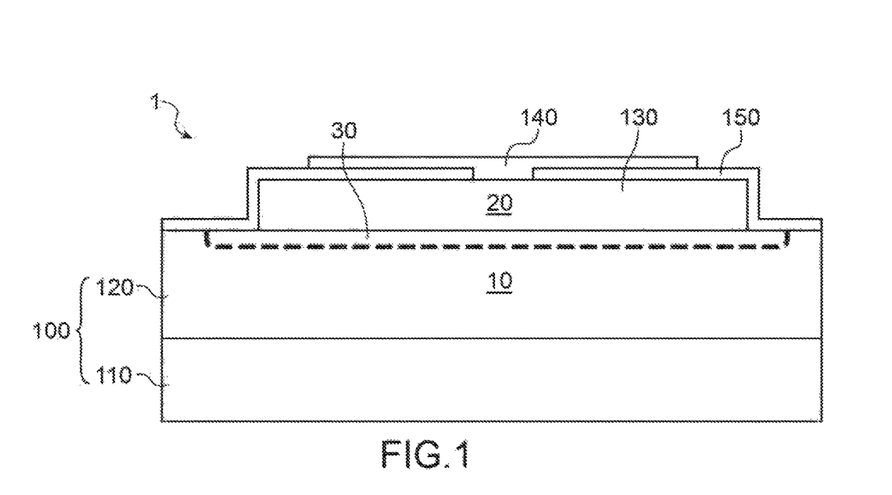
FIG. 1 is a schematic sectional view of a structure according to the invention.

FIG. 1 is a schematic sectional view of a structure according to the invention suited for detecting and/or measuring electromagnetic radiation in a given wavelength range.

The structure according to the invention is more particularly dedicated to the detection and/or the measurement of radiation in a wavelength range lying within the infrared range. It will be noted that the infrared range is divided into three sub-domains which are the near infrared range comprised between 1 and 3 μm, the mid infrared range comprised between 3 and 5 μm and the far infrared range corresponding to wavelengths comprised between 8 and 14 μm. In the design of the structures described in the following embodiments, the choice of material has focused on mercury-cadmium tellurides of $Cd_xHg_{1-x}Te$ type. According to the embodiment described below, the first type of conductivity corresponds to the type of conductivity for which the majority carriers are electrons, that is to say to N-doping, whereas the second type of conductivity corresponds to the type of conductivity for which the majority carriers are holes, that is to say to P-doping. Obviously, the first and the second type of conductivity may be reversed without going beyond the scope of the invention.

The terminology "mercury-cadmium telluride" used above and in the remainder of this document should be understood as corresponding to compounds including tellurium and at least one element selected from cadmium and mercury such as compounds meeting the following formulation $Cd_xHg_{1-x}Te$ with the value x corresponding to the proportion of cadmium Cd compared to mercury and is thus comprised between 1 and 0, 1 and 0 excluded.

Nevertheless, the invention is not limited solely to structures made from mercury-cadmium tellurides and also encompasses any type of structure, the design of which makes it possible to obtain absorption and photogeneration of carriers. Thus, although in the embodiments described hereafter the different semiconductor zones are made of mercury-cadmium tellurides, those skilled in the art can easily, on the basis of the present teaching, provide structures according to the invention of which the semiconductor zones would be made for example of indium arsenide-antimonide of $InAs_{1-x}Sb_x$ type, or instead indium and gallium arsenides of $In_{1-x}Ga_xAs$ type, The terminology "indium arsenide-antimonide" used above and in the remainder of this document should be understood as corresponding to compounds including of indium and at least one element selected from arsenic and antimony such as compounds meeting the following formulation $InAs_{1-x}Sb_x$ with the value x corresponding to the proportion of antimony compared to arsenic and is thus comprised between 1 and 0, 1 and 0 included.

The terminology "indium-gallium arsenides" used above and in the remainder of this document should be understood as corresponding to compounds including of arsenic and at least one element selected from indium and gallium such as compounds meeting the following formulation $In_{1-x}Ga_xAs$ with the value x corresponding to the proportion of gallium compared to indium and is thus comprised bets 1 and 0, 1 and 0 included.

In addition, if the structure 1 has semiconductor zones made of a single type of material such as mercury-cadmium tellurides and indium arsenides-antimonides, it may also be envisaged that a structure according to the invention has semiconductor zones made of several types of materials and notably by the presence of a substrate 110 made of a material of another type. Thus, for example, a structure having its "functional" zones made of mercury-cadmium tellurides may comprise a support made of zinc-cadmium telluride of $Cd_{1-y}Zn_yTe$ type with y the proportion of zinc comprised between 1 and 0, 1, and 0 excluded.

Such a structure 1 comprises:
a support 100 including of at least one semiconductor layer 120,
a mesa 130 in contact with the semiconductor layer 120.

The support 100 and its semiconductor layer 120 are chosen as being constituted of materials transparent in the given wavelength range.

Thus, the semiconductor support may be constituted of an insulator substrate 110 of zinc-cadmium telluride on which has been deposited a semiconductor layer of mercury-cadmium telluride of $Cd_xHg_{1-x}Te$ type with the value x of the proportion of cadmium being sufficiently high so that the semiconductor layer is transparent in the given wavelength range. The proportion x of cadmium in the mercury-cadmium telluride of the semiconductor layer may thus be chosen as follows:
for a given wavelength range in the near infrared, greater than 0.40,
for a given wavelength range in the mid infrared, greater than 0.3,
for a given wavelength range in the far infrared, greater than 0.15.

The zinc proportion of the substrate 110 is preferentially chosen so as to enable a good lattice match with the semiconductor layer 120 in order to obtain an interface between the substrate 110 and the semiconductor layer 120 having few, or even no, crystalline defects and without an intermediate layer such as a "buffer" layer.

Obviously, it may also be envisaged, without going beyond the scope of the invention, that the support further comprises, between the substrate 110 and the semiconductor layer, a so-called buffer layer suited to absorbing a part of the crystalline stresses between the substrate 110 and the semiconductor layer 210.

The substrate 110 has a first and a second longitudinal face each extending parallel to a main plane of the structure 1. The direction transversal to the main plane directed from the substrate 110 to the semiconductor layer 120 is a main direction of the structure.

The semiconductor layer 120 comprises a first and a second face, the first face being in contact with the second longitudinal face of the substrate 110. The semiconductor layer 120 is in contact on the surface of its second face with the mesa 130.

The semiconductor layer 120 has a thickness along the main direction comprised between 1 and 15 μm, typically from 2 to 4 μm and which may be for example equal to 3 μm.

The semiconductor layer 120 comprises a first and a third semiconductor layer 10, 30. The first semiconductor zone 10 extends from the first face of the semiconductor layer 120, the third semiconductor zone 30 extending from the surface of the second face in contact with the mesa 130 so as to be interposed between the mesa 130 and the first semiconductor zone 10.

The first semiconductor zone 10 is P-doped with a concentration of majority carriers comprised between $5.10^{15}$ $cm^{-3}$ and $1.10^{18}$ $cm^{-3}$.

The third semiconductor zone 30 forms an interface between the mesa 130, and thus a second semiconductor zone 20 which is included therein, and the first semiconductor zone 10. Its thickness is comprised between 100 nm and 500 nm, or even between 120 nm and 300 nm, and typically 150 nm.

The third semiconductor zone 30 is N-doped and has a concentration of majority carriers comprised between $10^{14}$ $cm^{-3}$ and $10^{16}$ $cm^{-3}$, the latter being preferentially less than that of the first semiconductor zone 10. With such an N-doping, the third semiconductor zone 30 forms, with the first semiconductor zone 10, a semiconductor junction, illustrated by a dotted line in FIG. 1, which is included in the semiconductor layer 120.

The mesa 130 extends from the surface of the second face of the semiconductor layer 120. The mesa 130 has along a main direction a height and in a plane transversal to the main direction, that is to say the main plane, at least one so-called width dimension. According to an advantageous possibility of the invention, the height and the width of the mesa 130 may be chosen as a function of the given wavelength range so as to optimize the absorption of electromagnetic radiation lying within said range.

Thus in the case of a given wavelength range lying within the infrared range, the height of the mesa 130 may be chosen as follows:

for a given wavelength range in the near infrared, the height of the mesa may be comprised between 0.2 μm and 1 μm, for a given wavelength range in the mid infrared, the height of the mesa may be comprised between 0.5 μm and 1.5 μm, for a given wavelength range in the far infrared, the height of the mesa may be comprised between 0.7 μm and 2.5 μm.

The height of the mesa 130 may advantageously be chosen so as to form a vertical Fabry-Pérot cavity, delimited by the metal contact pad 140 and the passivation layer 150 and by the contrast of index between the mesa 130 and the semiconductor layer 120. This possibility is particularly advantageous when the width of the mesa is large compared to the wavelengths of the wavelength range divided by the index of the second material.

If the width of the mesa 130 is comparable to the wavelengths of the wavelength range divided by the index of the second material, the width and the height of the mesa 130 may also be defined so as to form an optical cavity in the wavelength range, according to a possibility described in the document U.S. 2015/0303320, enabling a higher concentration of incident light in the optical cavity thus formed. According to this possibility, the section of the mesa along the main plane may be circular, square, or even hexagonal or rectangular, with dimensions suited to form a cavity according to the teaching of the document U.S. 2015/0303320.

Figure 3A:
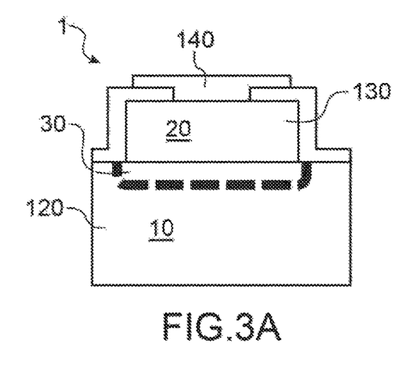
Figure 3B:
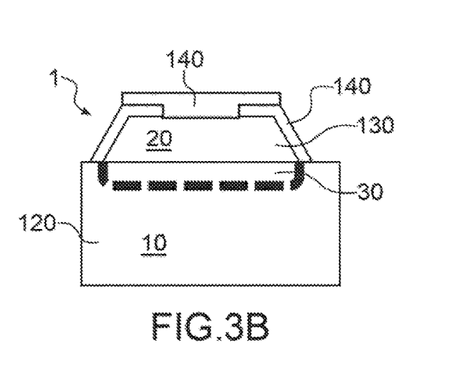

In a variant, only the second semiconductor zone 20 may be configured to form an optical cavity as described in document U.S. 2015/0303320. According, to this variant, the conditions for dimensioning the mesa described in the above two paragraphs apply to the second semiconductor zone 20. The section of the mesa 130 in the main plane may be, in the main direction, either constant, as illustrated in FIG. 3A, or variable, as illustrated in FIG. 3B. In the case where the section of the mesa 130 is variable, this variation as a function of the height along the main direction is preferentially monotonous. It will be noted that in this embodiment for which the mesa 130 is made of a mercury-cadmium telluride, the variation in the section of the mesa 130 as a function of the height along the main direction may be made according to an angle between the mesa 130 sides and the surface of the second face of the semiconductor layer 120 comprised between 90° and 30°.

The mesa 130 is made of a mercury-cadmium telluride of $Cd_xHg_{1-x}Te$ type with the value x of the proportion of cadmium that is suited to enabling absorption of electromagnetic radiation in the given wavelength range. Thus, the proportion x of cadmium Cd of the mercury-cadmium telluride in the mesa 130 may be chosen as follows:

for a given wavelength range in the near infrared, the proportion x is comprised between 0.35 and 0.6, for a given wavelength range in the mid infrared, the proportion x is comprised between 0.28 and 0.35, for a given wavelength range in the far infrared, the proportion x is comprised between 0.18 and 0.26.

The mesa 130, and thus the second semiconductor zone 20 that it forms, are N-doped. The concentration of majority carriers in the mesa 130, and thus in the second semiconductor zone 20, is adapted so that the second semiconductor zone 20 is included within the space charge zone, and is thus depleted, in the absence of polarization of the structure 1. Generally, such a condition may be obtained with a concentration of majority carriers comprised between $10^{14}$ cm$^{-3}$ and $10^{16}$ cm$^{-3}$.

Obviously, in order that such a condition of depletion of the second semiconductor zone 20 is met, the concentration of majority carriers of the mesa, and thus of the second semiconductor zone 20, is chosen as a function of the concentration of majority carriers of the first and the third semiconductor zones 10, 30. It may be noted that in so far as the second semiconductor zone 20 is depleted, the third semiconductor zone 30 is also depleted.

The top of the mesa 130, that is to say the part of the mesa 130 opposite to the semiconductor layer 120, is in contact with a metal contact pad 140. The part of the top of the mesa 130 that is not in contact with a metal contact pad 140 and the sides of the mesa 130, that is to say the lateral walls of the mesa 130 connecting the top of the mesa 130 to the semiconductor layer 120, are covered by means of a passivation layer 150. In other words, the passivation layer 150 has an opening through which the metal contact pad 140 is in contact with the top of the mesa 130. In the configuration illustrated in FIG. 1, the metal contact pad 140 advantageously covers a portion of the passivation layer 150 covering the top of the mesa 130. With such a configuration, the metal contact pad 140 is suited for connection to a remote reading circuit, not illustrated, by indium sphere hybridization.

The passivation layer 150 makes it possible to provide a perfectly defined and chemically stable delimitation of the second semiconductor zone 20.

The passivation layer 150 may be made of an insulator material such as a cadmium telluride CdTe, a zinc sulfide ZnS, a silicon dioxide $SiO_2$.

The metal contact pad 140 may be made of any type of metal able to form an ohmic contact with the second semiconductor zone 20. Thus the metal contact pad may be made of a metal selected from the group comprising gold Au, titanium Ti, chromium Cr and alloys thereof.

It will be noted that in FIG. 1, as well as in the other figures of the present document, no metal contact of the first semiconductor zone 10 has been represented. In fact, since the structures according to the invention are generally intended, to equip components in which they are organized in a matrix, their first semiconductor zones are polarized by means of a common remote contact. Thus the polarization of the structure according to the invention takes place by means of the metal contact pad 140 and a remote contact not illustrated in FIG. 1.

Obviously, such a usual possibility of common remote contact does not limit in any way the scope of the invention, the invention also encompassing the structures 1 comprising for the first semiconductor zone 10 a close individual contact.

Figure 2:
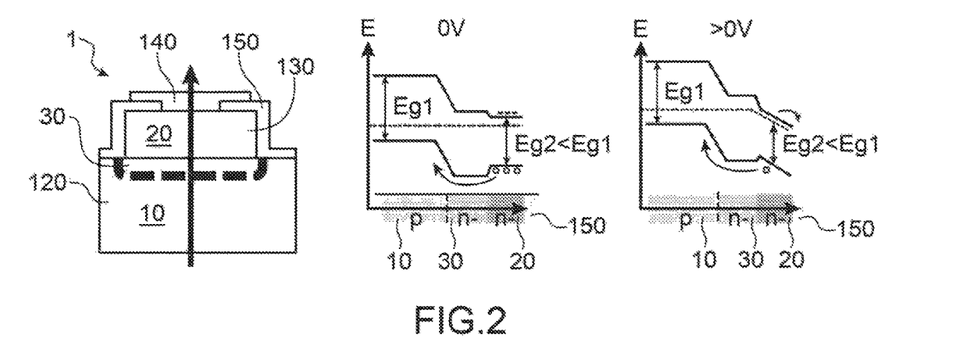
FIG. 2 schematically illustrates from left to right the reduced view of FIG. 1 in which is shown a main direction of the structure, a band diagram of the structure in the absence of polarization along the main direction and a band diagram of the structure under polarization along this same direction.

Thus, with such a structure, the semiconductor junction located in the semiconductor layer 12 does not intercept a region of the structure 1 having a high concentration of defects such as the sides of the mesa 130. In addition, as illustrate din FIG. 2 by the band diagram that is shown at the center thereof, the third semiconductor zone, in the absence of polarization, acts as a potential barrier for holes found in the valence band of the second semiconductor zone 20. Such a barrier, nevertheless, as illustrated in the band diagram of the structure in operation shown on the right of FIG. 2, does not perturb the operation of the structure. The structure 1 thus has a weak dark current in operation which makes it possible to envisage relatively high operating temperatures in applications thereof in the infrared range.

Such as structure 1 may be manufactured by means of a manufacturing method comprising the following steps:
   providing the support 100, said support 100 including the substrate 110 and the semiconductor layer 120,
   forming the mesa 130 in contact with the semiconductor layer 120,
   laying out the first, the second and the third semiconductor zones 10, 20, 30 in the semiconductor layer 120 and the mesa 130,
   depositing the passivation layer 150,
   forming the metal contact pad 140.

The step of providing the support 100 may include the following sub-steps:
   providing the substrate 110,
   depositing the semiconductor layer 120 in contact with the second face of the substrate 110.

In the step of providing the support, the semiconductor layer 120 is formed, for example by deposition, by including therein electron acceptor doping elements, that is to say of P type. In this embodiment, in which the semiconductor layer 120 is made of a mercury-cadmium telluride, the electron acceptor doping elements may be provided by doping elements as such, such as arsenic As, or by mercury Hg vacancies.

It may also be noted that, during this same step of providing the support 100, the semiconductor layer 120 may also comprise, in an intrinsic manner or by implantation, electron donor doping elements, the concentration of which is lower than that of the electron acceptor doping elements. This possibility is particularly advantageous for the formation of the third semiconductor zone 30 in the semiconductor layer 120 since it allows a revelation of the electron donor doping elements by a neutralization of the electron acceptor elements, for example while filling potential mercury Hg vacancies.

Thus, according to this possibility, the semiconductor layer may have, during the step of providing the support, a concentration of electron acceptor doping elements, such as mercury Hg vacancies, corresponding to a concentration of majority carriers of the first semiconductor zone 20, and a concentration of electron donor doping elements, such as indium In or iodine I, corresponding to a concentration of majority carriers of the third semiconductor zone 30. Obviously, since the concentration of majority carriers in the second semiconductor zone 20 is less than that of majority carriers in the first semiconductor zone 10, the semiconductor layer has, in these conditions and before laying out the semiconductor 10, 20, 30, a P-doping with a concentration of majority carriers corresponding to that of the second semiconductor zone 20.

The step of formation of the mesa may include the following sub-steps:
   depositing an additional semiconductor layer, not illustrated, the height of which, along the main direction of the structure 1, corresponds to the desired mesa 130 height,
   partial etching of the additional semiconductor layer, a portion of the semiconductor layer corresponding to the mesa 130 not being etched so as to form the mesa.

The partial etching of the additional semiconductor layer may be a step of wet etching, that is to say obtained by means of acid attack.

Whether it is the sub-step of deposition of the semiconductor layer 120 or that of the additional semiconductor layer, the deposition is preferentially carried out by molecular beam epitaxy so as to provide semiconductor layers of good crystalline quality with precise control of the composition thereof, notably concerning the concentration of doping elements and thus of majority carriers.

The step of laying out the first, the second and the third semiconductor zones 10, 20, 30 in the semiconductor layer 120 and in the mesa 130 may be carried out in different ways.

Figure 4A:
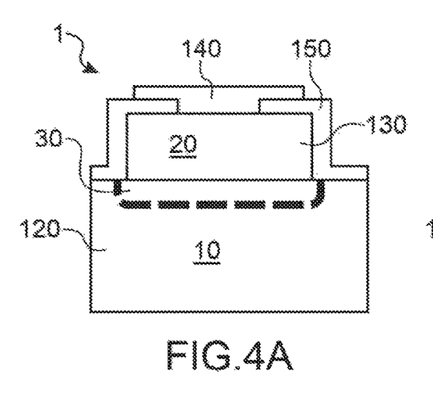
Figure 4B:
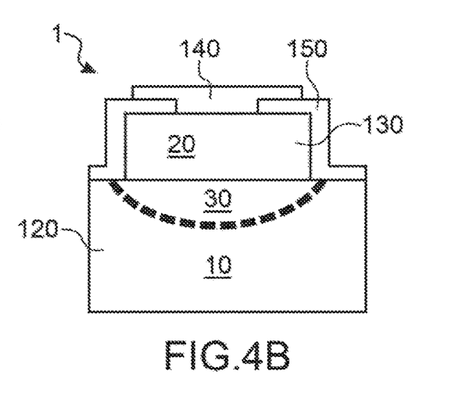
Figure 4C:
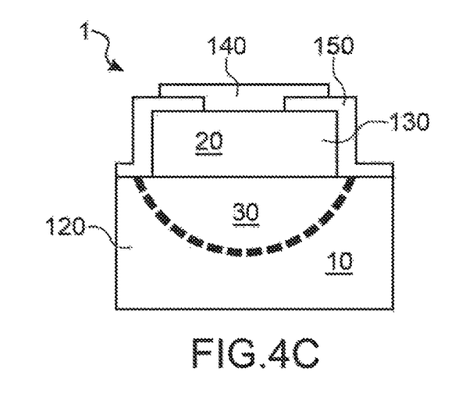

Thus FIGS. 4A to 4C illustrate three structures 1 obtained by means of three respective lay out variants, all three based on a step of providing the support 100 in which the semiconductor layer 120 comprises a concentration of majority carriers corresponding to that of the first semiconductor zone 10 which is provided by the presence of mercury Hg vacancies.

The structure illustrated in FIG. 4A corresponds to a lay out step in which the concentration of majority carriers in the second and the third zones 20, 30 is provided by implantation of ions such as boron B ions. Such an implantation of boron B ions in the mesa 130 makes it possible to release mercury Hg and generates a migration, or diffusion, of the mercury Hg thus released into the semiconductor layer in the vicinity of the mesa 130. This mercury Hg makes it possible to fill the vacancies of the semiconductor layer with mercury Hg and to cancel the P-doping in the vicinity of the mesa 130 while revealing the residual N-doping of the mercury-cadmium telluride. The mesa 130 and a portion of the semiconductor layer 120 in the vicinity of the mesa thus have an N-doping and therefore form respectively the second and the third semiconductor zones 20, 30, whereas the remainder of the semiconductor layer forms the first semiconductor zone 10.

The structure 1 illustrated in FIG. 4B corresponds to a lay out step in which the concentration of majority carriers in the second and the third zones 20, 30 is provided by a dry etching, for example plasma etching. Such an etching makes it possible, in the same way as ion implantation, to release mercury Hg and to generate a migration, or diffusion, of the mercury Hg thus released into the semiconductor layer in the vicinity of the mesa 130. In the same way as for ion implantation, this migration of mercury Hg makes it possible to form the first, second and third semiconductor zones 10, 20, 30. This lay out variant has the advantage of making it possible to provide an opening in the mesa 130 to optimize the contact between the second semiconductor zone 20 and the metal contact pad 140. In fact, the contact pad 150 may be formed in the opening released by the etching, the contact between the mesa 130 and the contact pad 150 then taking place over the whole surface of the opening.

The structure illustrated in FIG. 4C corresponds to the lay out step in which the concentration of majority carriers in the second and the third zones 20, 30 is provided by a localized diffusion of mercury Hg from an opening arranged in the passivation layer 150. Such a step consists in a step of thermal treatment under mercury Hg atmosphere whereas the opening has been laid out beforehand in the passivation layer. This thermal treatment enable mercury Hg to be made to diffuse into the mesa 130 and into the semiconductor layer 120 in the vicinity of the mesa 130. In this way and according to the same principle as ion implantation and etching, the mercury Hg diffuses and makes it possible to fill the mercury Hg vacancies and to form the first, second and third semiconductor zones 10, 20, 30. In this third variant of laying out the first, second and third semiconductor zones 10, 20, 30, it is this same opening that is used to place in contact the metal contact pad 140 and the mesa 130.

In these three variants of lay out steps, the conditions of these steps, such as the implantation energy, the etching depth and the duration of the thermal treatment, make it possible to define the mercury Hg diffusion distance and thus, the dimensions of the third zone 30 and the position of the semiconductor junction.

Obviously, if the three variants of the lay out step enables easy laying out of the first, second and third semiconductor zones 10, 20, 30, it is also possible to provided the lay out of the first, second and third semiconductor zones 10, 20, 30 by a method of implantation of doping elements. If such a lay out step requires a lay out of the first, second and third zones in several sub-steps, the implantation of the third zone having to be, for example, carried out before the step of forming the mesa, it has the advantage of being able to be carried out whatever the type of doping of the semiconductor layer 120.

Figure 5A:
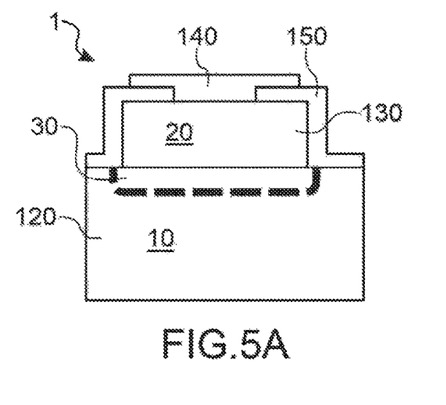
FIGS. 5A and 5B are schematic sectional views of a first and second possibility of the invention, the structure comprising a mesa which, in the first possibility, includes uniquely the second semiconductor zone of the structure and, in the second possibility, includes the second semiconductor zone and a part of the third semiconductor zone.
Figure 5B:
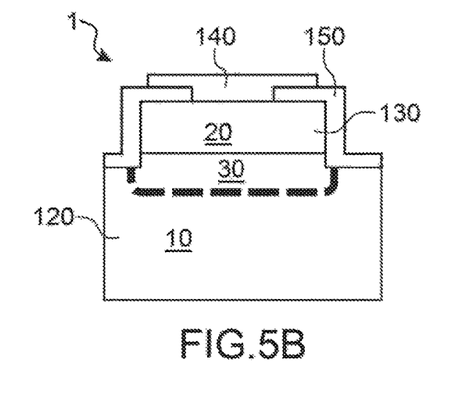

FIGS. 5A and 5B illustrate two possibilities of the invention concerning the positioning of the third zone 30. In fact, as described above in this first embodiment and as illustrated in FIG. 5A, the third semiconductor zone 30 may be totally included in the semiconductor layer.

Nevertheless, second embodiment illustrated in FIG. 5B, the third semiconductor zone 30 may also be partially included in the mesa 130. Thus this structure according to this second embodiment differs from the structure 1 according to the first embodiment in that the third semiconductor zone 30 is partially included in the mesa, the remainder of the third semiconductor zone 30 remaining included in the semiconductor layer 120 in the proximity of the mesa 130.

In this second embodiment, the mesa 130 has the portion of mesa by which it is in contact with the semiconductor layer 120 and which is made of the same material as the semiconductor layer. This portion of mesa is thus transparent in the given wavelength range. The portion of mesa is interposed between the semiconductor layer 120 and the remainder of mesa 130 forming the second semiconductor zone.

In other words, the portion of mesa 120 has the same characteristics as the remainder of the third zone 30 which is laid out in the semiconductor layer 120, whereas the remainder of the mesa has the characteristics of the second semiconductor zone as described in the first embodiment. In particular, the dimensioning of the second semiconductor zone 20 remains identical to that described in the first embodiment, the mesa 120 according to this second embodiment thus has a height along the main direction of the structure 1 greater than that of the first embodiment since its height corresponds to the addition of the heights of the portion of mesa and the second semiconductor zone 20.

The height of the portion of mesa 30 is preferentially chosen as being less than that of the second semiconductor zone 20.

The method for manufacturing a structure 1 according to this second embodiment differs from the method for manufacturing a structure 1 according to the first embodiment in that a step of partial etching of the semiconductor layer 120 is provided so as to form the portion of the mesa. This partial etching may be carried out during the partial etching of the additional semiconductor layer.

Figure 6A:
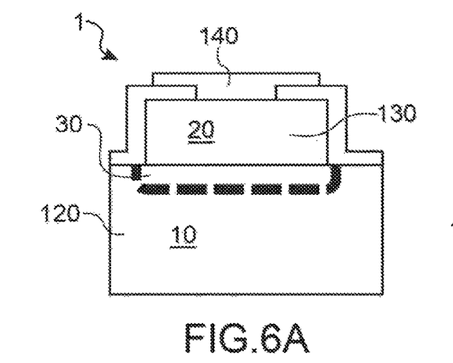
FIGS. 6A and 6B illustrate two possibilities of upper contact of the invention, FIG. 6A corresponding to the possibility of simple contact, FIG. 6B corresponding to a possibility of the invention wherein the upper contact also acts as a mirror to concentrate electromagnetic radiation.
Figure 6B:
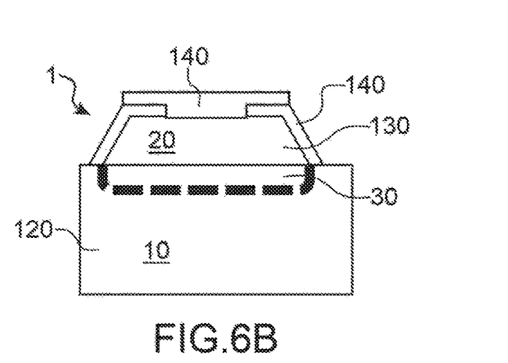

It may also be noted, in compliance with FIGS. 6A and 6B, that the metal contact 140 may also include a metal layer covering, with the contact pad, the integrality of the top and the sides of the mesa.

In fact, FIG. 6A shows the configuration of the metal contact pad 140 as already described within the scope of the first embodiment, such a configuration being suited for a connection by indium sphere hybridization to a remote reading circuit. FIG. 6B illustrates the possibility according to which the metal contact includes, in addition to the metal contact pad 140, a metal layer 141 making it possible, in addition to the metal contact pad 140, to cover the top and the sides of the mesa 130.

FIG. 6B shows that, in the same way as in the configuration described in relation to the first embodiment, the passivation layer 1 has an opening on the top of the mesa 130 through which the metal contact pad 140 is in contact with the mesa 120. The metal contact pad 140 extends for its part covering a portion of the passivation layer 150, through the metal layer 141. In this way, the mesa 120 is entirely housed in a cavity formed by the metal contact pad 140 and the metal layer 141 which are reflective for electromagnetic radiation. This thus makes it possible to increase the optical filling rate the second semiconductor zone 20 by reflection of the electromagnetic radiation entering into the mesa 130 on the sides of the mesa. This possibility, illustrated in FIG. 6B, is particularly advantageous in the case where the mesa 130 is dimensioned to form a Fabry-Pérot cavity.

Figure 7:
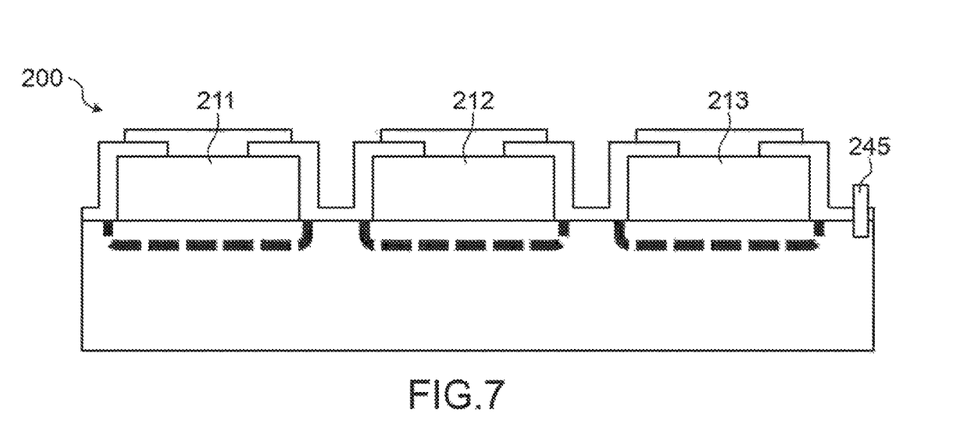
FIG. 7 illustrates an example of component comprising several structures according to the invention distributed in the form of a matrix, Identical, similar or equivalent parts of the different figures bear the same numerical references in order to make it easier to go from one figure to the next.

The structures 1 of the first and second embodiments, according to the different possibilities and variants described above, are particularly suited to providing a component, such as a photodetector, in which they are associated in a matrix, each of the structures forming a pixel of said photodetector. FIG. 7 makes it possible to illustrate such a possibility of component 200. In this FIG. 7, only three structures 211, 212, 213 of a line are represented, all three of these structures being identical to that illustrated in FIG. 1. FIG. 7 also shows the presence of a remote metal contact 245 common to the set of structures 211, 212, 213 of the component 200.

It will also be noted that the structures according to the invention, in an identical manner to the structure described by K. Jóźwikowski and his co-authors, may be associated with an optical concentration system, such as a lens, to concentrate electromagnetic radiation in the second semiconductor zone. Such a possibility makes it possible to conserve good sensitivity of the structure despite an active zone, the second zone 20, of reduced dimensions.

Obviously, the arrangement of the first, second and third semiconductor zones 10, 20, 30 described in the above embodiments is given by way of illustration and is in no way limiting. Thus, the invention covers all arrangements of these three semiconductor zones 10, 20, 30, whereas the first zone 10 is laid out in a semiconductor layer 120 of the support 100, the third semiconductor zone 30 being at least in part included in this same semiconductor layer 120 to form the semiconductor junction 10 with the first semiconductor zone 10 in the semiconductor layer 120, and that the second semiconductor zone 20 is laid out in the mesa 130 while forming with the third semiconductor zone 30 a potential barrier for the minority carriers of the second semiconductor zone 20. Thus, the invention also covers, for example, a third semiconductor zone 30 that extends over the whole thickness of the semiconductor layer 120, the second semiconductor zone 20 then being found on the side of the mesa 130.

The invention claimed is:

1. A photodiode type structure intended to receive electromagnetic radiation in a given wavelength range, the photodiode type structure comprising:
   a support including at least one semiconductor layer, the semiconductor layer including of a first semiconductor zone of a first type of conductivity, the first semiconductor zone being made of a first semiconductor material having a forbidden band gap such that the first semiconductor zone is transparent in the given wavelength range;
   a mesa in contact with the semiconductor layer, the mesa including a second semiconductor zone, known as absorption zone, the second semiconductor zone being of a second type of conductivity opposite to the first type of conductivity so as to form a semiconductor junction having a space charge zone, the second semiconductor zone being made of a second semiconductor material having a forbidden band gap suited to favoring the absorption of electromagnetic radiation, the second semiconductor zone having a concentration of majority carriers such that the second semiconductor zone is included within the space charge zone, and is thus depleted, in the absence of polarization of the structure; and
   a third semiconductor zone of the second type of conductivity made of a third semiconductor material having a forbidden band gap such that the third semiconductor zone is transparent in the given wavelength range, the third semiconductor zone being interposed between the first and the second semiconductor zones while being at least partially arranged in the semiconductor layer and while forming the semiconductor junction with the first semiconductor zone in the semiconductor layer, wherein the third semiconductor zone also forming with the second semiconductor zone a potential barrier for minority carriers of the second semiconductor zone.

2. The photodiode type structure according to claim 1, wherein the first and the third semiconductor material are identical.

3. The photodiode type structure according to claim 1, wherein the third semiconductor zone is partially arranged in the semiconductor layer, a part of the third semiconductor zone being arranged in the mesa.

4. The photodiode type structure according to claim 1, wherein the third semiconductor zone is totally arranged in the semiconductor layer.

5. The photodiode type structure according to claim 1, wherein the mesa has a top, opposite to the surface of the support, and sides connecting the top to the surface of the support,
   the photodiode type structure further comprising a passivation layer and a metal contact pad in contact with the top of the mesa, the passivation layer being arranged to passivate the surface of the sides and the top of the mesa which is not in contact with the metal pad.

6. The photodiode type structure according to claim 5, further including a metal layer which, with the metal contact pad, covers the passivation layer on its part covering the surface of the sides and the top of the mesa.

7. The photodiode type structure according to claim 1, wherein the first, the second and the third materials are mercury-cadmium tellurides of $Cd_xHg_{1-x}Te$ type with x comprised between 1 and 0, 0 and 1 excluded.

8. The photodiode type structure according to claim 1, wherein the first type of conductivity is that for which the majority carriers are electrons, the second type of conductivity being that for which the majority carriers are holes.

9. The photodiode type structure according to claim 7, wherein the first type of conductivity is that for which the majority carriers are electrons, the second type of conductivity being that for which the majority carriers are holes, and
   wherein the concentration of majority carriers in the first semiconductor zone is supplied mainly by mercury Hg vacancies.

10. A component for at least one of detection and measurement of electromagnetic radiation in the given wavelength range, the component comprising:
    a plurality of photodiode type structures, wherein at least one of the plurality of photodiode type structures is the photodiode type structure according to claim 1.

11. A method for manufacturing a photodiode type semiconductor structure intended to receive electromagnetic radiation in a given wavelength range, the method comprising:
    providing a semiconductor support comprising at least one semiconductor layer;
    forming a mesa on the surface of the semiconductor layer; and
    laying out in the semiconductor layer and in the mesa, a first, a second and a third semiconductor zone, the first semiconductor zone being laid out in the semiconductor layer and being of a first type of conductivity and made of a first material having a forbidden band gap such that the first semiconductor zone is transparent in the given wavelength range, the second semiconductor zone being of a second type of conductivity opposite to the first type of conductivity so as to form a semiconductor junction having a space charge zone, the second semiconductor zone being made of a second semiconductor material having a forbidden band gap suited to favoring the absorption of electromagnetic radiation, the second semiconductor zone having a concentration of majority carriers such that the second semiconductor zone is included within the space charge zone, and is thus depleted in the absence of polarization of the structure, the third semiconductor zone being of the second type of conductivity and made of a third material having a forbidden band gap such that the third semiconductor zone is transparent in the given wavelength range, the third semiconductor zone being interposed between the first and the second semiconductor zone while being at least partially arranged in the semiconductor layer and while forming the semiconductor junction with the first semiconductor zone in the semiconductor layer, wherein the third semiconductor zone also forming with the second semiconductor zone a potential barrier for minority carriers of the second semiconductor zone.

12. The manufacturing method according to claim 11, wherein during the providing of the support, the semiconductor layer is made of a mercury-cadmium telluride of $Cd_xHg_{1-x}Te$ type, with x comprised between 0 and 1, 0 and 1 excluded, and has the first type of conductivity, the first type of conductivity being that in which the majority carriers are holes, the majority carriers in the semiconductor layer being mainly supplied by mercury Hg vacancies, and the laying out of first, second and third semiconductor zones includes diffusion of mercury into a part of the semiconductor layer so as to fill the mercury Hg vacancies and neutralize the holes to reverse the type of conductivity in said part of the semiconductor layer and thus form the third semiconductor zone, a remainder of the semiconductor layer then forming the second semiconductor zone.

13. The manufacturing method according to claim 12, wherein during the laying out of first, second and third semiconductor zones, the diffusion includes ion implantation of the mesa suited to releasing mercury Hg.

14. The manufacturing method according to claim 12, wherein during the laying out of first, second and third semiconductor zones, the diffusion includes partial etching of the mesa suited to releasing mercury Hg.

15. The manufacturing method according to claim 12, wherein during the laying out of first, second and third semiconductor zones, the diffusion includes thermal diffusion of mercury into the mesa.

* * * * *